(12) United States Patent
Cao et al.

(10) Patent No.: US 12,199,195 B2
(45) Date of Patent: Jan. 14, 2025

(54) SOLAR CELL, PHOTOVOLTAIC MODULE, AND METHOD FOR MANUFACTURING PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Yuncheng Cao, Zhejiang (CN); Yingli Guan, Zhejiang (CN); Shiliang Huang, Zhejiang (CN); Zhiqiu Guo, Zhejiang (CN); Jianghai Du, Zhejiang (CN)

(73) Assignees: Jinko Solar Co., Ltd., Jiangxi (CN); Zhejiang Jinko Solar Co., Ltd., Haining (CN)

( * ) Notice: Subject to any disclaimer, the term of this patent is extended or adjusted under 35 U.S.C. 154(b) by 0 days.

(21) Appl. No.: 18/091,260

(22) Filed: Dec. 29, 2022

(65) Prior Publication Data
US 2024/0088306 A1 Mar. 14, 2024

(30) Foreign Application Priority Data

Sep. 9, 2022 (CN) .......................... 202211104536.9
Nov. 22, 2022 (CN) .......................... 202211465763.4

(51) Int. Cl.
*H01L 31/02* (2006.01)
*H01L 31/0224* (2006.01)
(Continued)

(52) U.S. Cl.
CPC .. *H01L 31/0201* (2013.01); *H01L 31/022441* (2013.01); *H01L 31/02366* (2013.01);
(Continued)

(58) Field of Classification Search
CPC ................... H01L 31/0201; H01L 31/022441
See application file for complete search history.

(56) References Cited

U.S. PATENT DOCUMENTS

| 8,574,951 B1 | 11/2013 | Wang |
| 2008/0216887 A1 | 9/2008 | Hacke et al. |

(Continued)

FOREIGN PATENT DOCUMENTS

| CN | 104157717 A | 11/2014 |
| CN | 208256682 U | 12/2018 |

(Continued)

OTHER PUBLICATIONS

Iwakura et al., JP-2004047824-A, English Machine Translation (Year: 2004).*

(Continued)

*Primary Examiner* — Tae-Sik Kang
(74) *Attorney, Agent, or Firm* — Knobbe, Martens, Olson & Bear, LLP

(57) ABSTRACT

Disclosed is solar cell, a photovoltaic module, and a method for manufacturing a photovoltaic module. The solar cell includes a substrate, first busbars and second busbars arranged on the substrate, first fingers connected to the first busbars, and second fingers connected to the second busbars. The first busbars and the second busbars have opposite polarities. The first fingers have a same polarity as the first busbars, and the second fingers have a same polarity as the second busbars. The substrate is provided with busbar pits. At least part of the first and second busbars are located in the busbar pits. Depths of the busbar pits range from 30 μm to 50 μm. Along a thickness direction of the substrate, ratios of the depths of the busbar pits to heights of the first busbars and/or the second busbars range from 10:3 to 6:5.

20 Claims, 9 Drawing Sheets

(51) Int. Cl.
   *H01L 31/0236* (2006.01)
   *H01L 31/05* (2014.01)
   *H01L 31/068* (2012.01)
   *H01L 31/18* (2006.01)

(52) U.S. Cl.
   CPC ...... *H01L 31/0516* (2013.01); *H01L 31/0682* (2013.01); *H01L 31/1804* (2013.01)

(56) References Cited

U.S. PATENT DOCUMENTS

| | | |
|---|---|---|
| 2010/0300525 A1 | 12/2010 | Lim et al. |
| 2011/0030777 A1 | 2/2011 | Lim et al. |
| 2011/0146782 A1 | 6/2011 | Gabor et al. |
| 2014/0090698 A1* | 4/2014 | Kumai ............... H01L 31/0516 174/250 |
| 2015/0129026 A1 | 5/2015 | Jung et al. |
| 2018/0219109 A1 | 8/2018 | Nishimoto |

FOREIGN PATENT DOCUMENTS

| | | |
|---|---|---|
| CN | 110212038 A | 9/2019 |
| CN | 111403534 A | 7/2020 |
| CN | 113327999 A | 8/2021 |
| CN | 216902960 | 8/2021 |
| CN | 114628542 A | 6/2022 |
| CN | 114765224 A | 7/2022 |
| DE | 102017108077 A1 | 10/2018 |
| EP | 2605286 A1 * | 6/2013 ..... H01L 31/022441 |
| EP | 3244454 A1 | 11/2017 |
| JP | H03165578 A | 7/1991 |
| JP | 2004047824 A * | 2/2004 ....... H01L 31/03529 |
| JP | 2006-032698 A | 2/2006 |
| JP | 2006-229240 A | 8/2006 |
| JP | 2010-519732 A | 6/2010 |
| JP | 2015-518286 A | 6/2015 |
| JP | 2015109364 A | 6/2015 |

OTHER PUBLICATIONS

Office Action issued in corresponding Chinese Application No. 2022111045369 dated Aug. 12, 2023 in 7 pages.
Office Action in Japanese Application No. 2023-000420, issued date of May 16, 2023 in 14 pages.
Extended European Search Report recieved in Application No. EP 23150891.2 dated Aug. 22, 2023 in 12 pages.
Cotter et al. Laser-Grooves Backside Contact Solar Cells with 680-mv Open-Circuit Voltage, IEEE Transactions on Electron Devices, IEEE, USA, vol. 51, No. 12 (Dec. 2004), pp. 2186-2192.
Mughal et al., "Helic Cell: Laser-cut 1-10 grooves to create high efficiency, low-cost IBC Solar Cell," 2014 IEEE 40th Photovoltaic Specialist Conference, IEEE, (Jun. 8, 2014), pp. 2514-2518.
Australian Office Action received in Application No. 2023200017 dated Nov. 23, 2023 in 10 pages.
Office Action of corresponding Japanese Patent Application No. 2024-005841 issued on May 7, 2024 in 4 pages.

* cited by examiner

SOLAR CELL, PHOTOVOLTAIC MODULE, AND METHOD FOR MANUFACTURING PHOTOVOLTAIC MODULE

CROSS-REFERENCE TO RELATED APPLICATIONS

The present application claims priority to Chinese Patent Application No. 202211104536.9, filed on Sep. 9, 2022, and to Chinese Patent Application No. 202211465763.4, filed on Nov. 22, 2022, the disclosures of which are incorporated herein by reference in their entireties.

TECHNICAL FIELD

The present disclosure relates to the technical field of solar cells, and in particular, to a solar cell, a photovoltaic module, and a method for manufacturing a photovoltaic module.

BACKGROUND

With the continuous innovation of solar cell technologies, related cell technologies have also been significantly developed at present. As a new solar cell structure, an interdigitated back contact (IBC) solar cell has attracted more and more attention.

The IBC refers to a solar cell having no electrode on the front of the solar cell, and positive electrodes and negative electrodes metal electrodes are both arranged on the back of the solar cell in an interdigitated manner. The most prominent feature of the IBC is that PN junctions and metal contacts are on the back of the solar cell and the front is not shielded by the metal electrodes, so there is a higher short-circuit current Jsc and, at the same time, the back can allow wider metal electrodes to reduce series resistance Rs so as to improve the fill factor (FF). In conjunction with open-circuit voltage gain brought by a front surface field (FSF) and a good passivation effect of the solar cell, the solar cell with the unshielded front surface has high conversion efficiency and has better appearance. At the same time, it is easier to assemble a full back electrode module.

At present, in order to prevent short circuit of the IBC, insulating paste is applied around busbars, which leads to poor soldering tension of the IBC.

SUMMARY

The present disclosure provides a solar cell, a photovoltaic module, and a method for manufacturing a photovoltaic module, which can improve soldering tension between solar cells and solder strips.

In a first aspect of the present disclosure, a solar cell is provided, including: a substrate; first busbars and second busbars arranged on the substrate and extending along a first direction, the first busbars and the second busbars are arranged alternately along a second direction intersecting with the first direction, and the first busbars and the second busbars have opposite polarities; first fingers and second fingers arranged on the substrate and extending along the second direction, the first fingers and the second fingers are arranged alternately along the first direction, the first fingers are connected to the first busbars, the second fingers are connected to the second busbars, the first fingers have a same polarity as the first busbars, and the second fingers have a same polarity as the second busbars; and busbar pits provided on the substrate and spaced apart along the second direction, and at least part of the first busbars and at least part of the second busbars being located in the busbar pits. Along a thickness direction of the substrate, depths h1 of the busbar pits satisfy: 30 μm≤h1≤50 μm; and ratios of the depths of the busbar pits to heights of the first busbars and/or the second busbars range from 10:3 to 6:5.

In some embodiments, the busbar pits extend along the first direction, and the first busbars and the second busbars are arranged in the busbar pits.

In some embodiments, the busbar pits are spaced apart along the first direction, and part of the first busbars and part of the second busbars are located in the busbar pits.

In some embodiments, the first busbars and the second busbars are provided with electrode pads spaced apart along the first direction; and the busbar pits include first pits and second pits spaced apart along the first direction, the first pits and the electrode pads are arranged opposite to each other along the thickness direction of the substrate, and depths of the first pits are greater than the second pits.

In some embodiments, the substrate is further provided with finger pits spaced apart along the first direction, and at least part of the first fingers and at least part of the second fingers are located in the finger pits.

In some embodiments, the finger pits extend along the second direction, and the first fingers and the second fingers are arranged in the finger pits.

In some embodiments, the finger pits are spaced apart along the second direction, and part of the first fingers and part of the second fingers are located in the busbar pits.

In some embodiments, along the thickness direction of the substrate, the depths of the busbar pits are greater than the finger pits.

In some embodiments, along the thickness direction of the substrate, the depths h2 of the finger pits satisfy: 25 μm≤h2≤35 μm.

In some embodiments, widths of the busbar pits along the second direction are W1, widths of the finger pits along the first direction are W2, and W1≥W2.

In some embodiments, the widths W1 of the busbar pits along the second direction satisfy: 40 μm≤W1≤70 μm; and/or the widths W2 of the finger pits along the first direction satisfy: 25 μm≤W2≤35 μm.

In some embodiments, cross sections of the busbar pits along the second direction are in shapes of rectangles, semi-circles, triangles, arcs or trapezoids.

In some embodiments, the substrate includes a first surface and a second surface arranged opposite to each other in the thickness direction, the first surface is located on a side of the solar cell facing the sunlight; and the first busbars, the second busbars, the first fingers, and the second fingers are arranged on the second surface.

In some embodiments, the heights H1 of the first busbars satisfy: 15 μm≤H1≤25 μm, and/or the heights H2 of the second busbars satisfy: 15 μm≤H2≤25 μm; and/or heights H3 of the first fingers satisfy: 15 μm≤H3≤25 μm, and/or heights H4 of the second fingers satisfy: 15 μm≤H4≤25 μm.

In a second aspect of the present disclosure, a photovoltaic module is provided, including glass, a first packaging adhesive film, a solar cell string, a second packaging adhesive film, and a back sheet arranged successively along a thickness direction, the solar cell string includes solar cells described in any one of the above embodiments and solder strips configured to connect adjacent solar cells; the solar cells include first solar cells and second solar cells staggered along the first direction, and along the first direction, the first busbars on the first solar cells and the second busbars on the second solar cells are located on a same extension line, and the second busbars on the first solar cells and the first busbars on the second solar cells are located on a same extension line; and the solder strips are respectively connected to the first busbars and the second busbars on the adjacent solar cells, and along thickness directions of the solar cells, the solder strips are arranged on sides of the first busbars and the second busbars away from the substrate, and at least part of the solder strips are located in the busbar pits.

In some embodiments, the solder strips include body portions and protruding portions, the protruding portions are spaced apart along the first direction, and at least part of the protruding portions are located in the busbar pits.

In some embodiments, along the thickness directions of the solar cells, heights h3 of the body portions satisfy: 150 µm≤h3≤300 µm; and heights h4 of the protruding portions satisfy: 35 µm≤h4≤65 µm.

In some embodiments, 15% to 25% of the solder strips are located in the busbar pits.

In a third aspect of the present disclosure, a method for manufacturing a photovoltaic module is provided, the photovoltaic module including a plurality of solar cells and solder strips configured to connect adjacent solar cells; the solar cells each include a substrate, first busbars and second busbars arranged on the substrate and extending along a first direction, first fingers and second fingers arranged on the substrate and extending along a second direction intersecting with the first direction, and busbar pits arranged on the substrate; the busbar pits are spaced apart along the second direction, and at least part of the first busbars and at least part of the second busbars are located in the busbar pits; the solder strips are respectively connected to the first busbars and the second busbars on the adjacent solar cells, and along thickness directions of the solar cells, the solder strips are arranged on sides of the first busbars and the second busbars away from the substrate, and at least part of the solder strips are located in the busbar pits; and the substrate includes a first surface and a second surface arranged opposite to each other in the thickness direction, the first surface is located on a side of the photovoltaic module facing the sunlight, and the first busbars, the second busbars, the first fingers, the second fingers, and the solder strips are located on the second surface. The method for manufacturing a photovoltaic module includes: etching the busbar pits on the second surface of the substrate; doping the substrate, and forming n+ doping regions and p+ doping regions arranged alternately after the doping; manufacturing a metal electrode on the second surface; placing the solder strips on the solar cells with part of the solder strips extending into the busbar pits; and fixing the solder strips and the solar cells through electrode pads.

In some embodiments, the substrate is further provided with finger pits spaced apart along the first direction, and at least part of the fingers are located in the finger pits, prior to the step of doping the substrate, and forming n+ doping regions and p+ doping regions arranged alternately after the doping, the method for manufacturing a photovoltaic module further includes: etching the finger pits on the second surface.

It is to be understood that the general description above and the detailed description below are only examples and cannot limit the present disclosure.

The accompanying drawings herein are incorporated in and constitute a part of this specification, illustrate embodiments consistent with the present disclosure and, together with the description, serve to explain the principles of the present disclosure.

DETAILED DESCRIPTION

In order to better understand the technical solution of the present disclosure, embodiments of the present disclosure are described in detail below with reference to the accompanying drawings.

It is to be made clear that the described embodiments are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after it are in an "or" relationship.

It is to be noted that the location terms such as "above", "below", "left", and "right" described in the embodiments of the present disclosure are described with reference to the angles shown in the accompanying drawings, and should not be construed as limitations on the embodiments of the present disclosure. In addition, in the context, it is to be further understood that, when one element is referred to as being connected "above" or "below" another element, the one element may be directly connected "above" or "below" another element, or connected "above" or "below" another element via an intermediate element.

Figure 1:
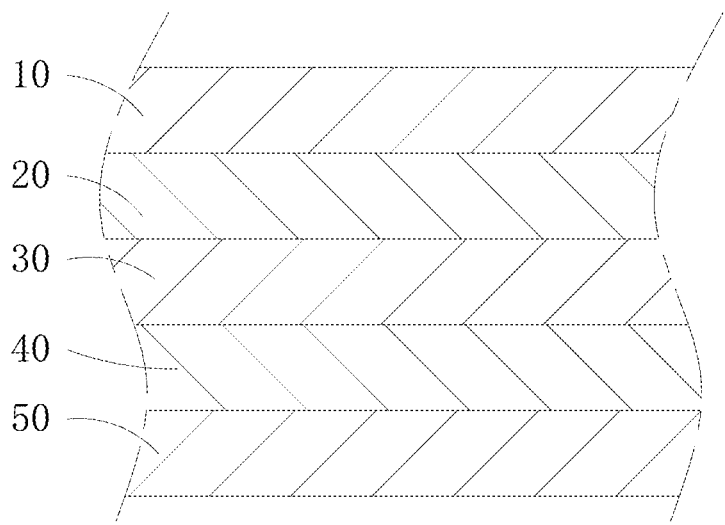
FIG. 1 is a sectional view of a photovoltaic module according to one or more embodiments of the present disclosure.
Figure 2:
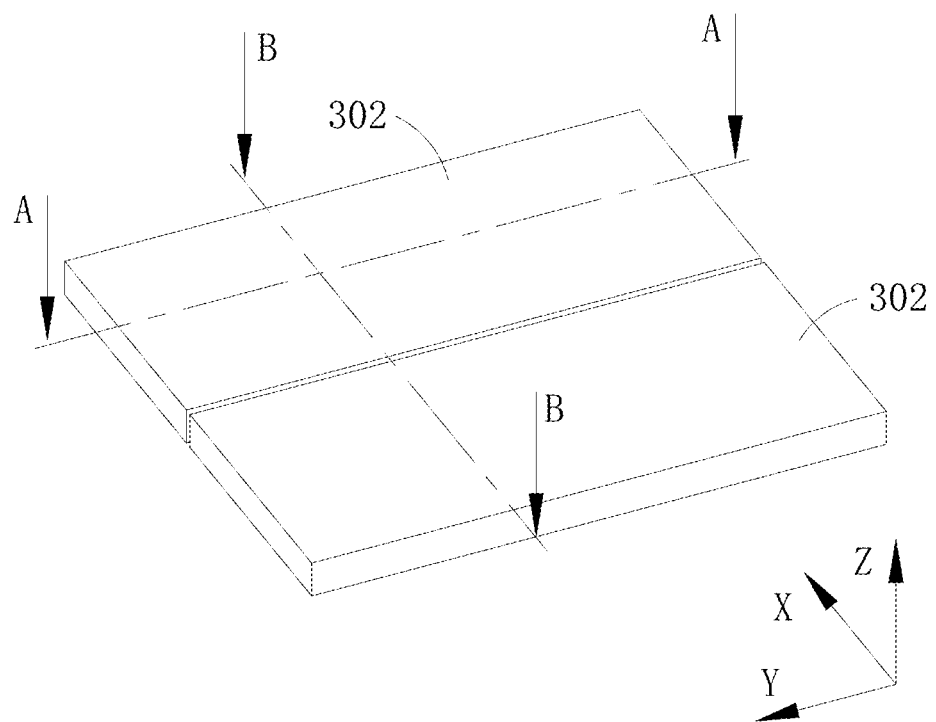
FIG. 2 is a schematic structural diagram of a solar cell string in FIG. 1 according to one or more embodiments of the present disclosure, in which two solar cells are taken as an example.
Figure 3:
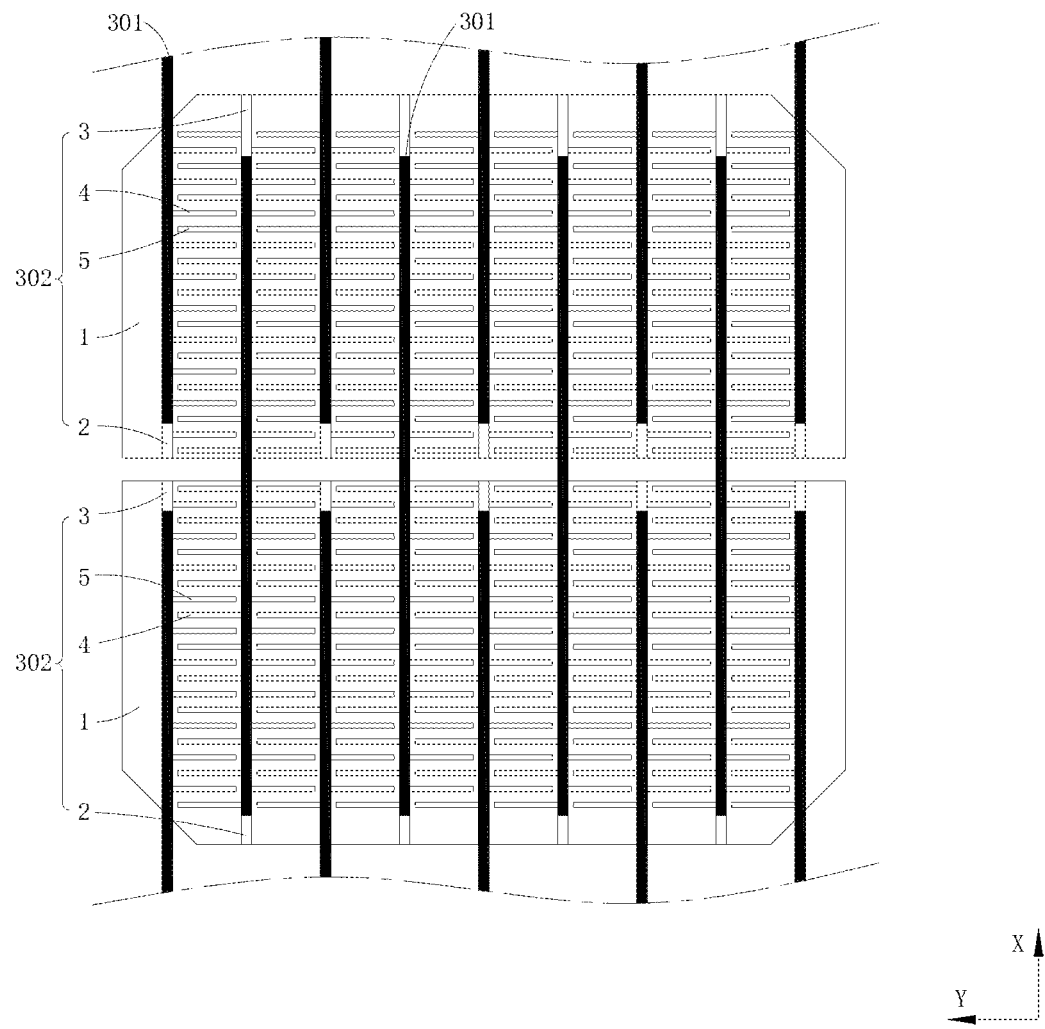
FIG. 3 is a top view of the solar cell string in FIG. 2 in a third direction.

Embodiments of the present disclosure provide a photovoltaic module. As shown in FIG. 1, the photovoltaic module includes glass 10, a first packaging adhesive film 20, a solar cell string 30, a second packaging adhesive film 40, and a back sheet 50 arranged successively along a thickness direction thereof. As shown in FIG. 2 and FIG. 3, the solar cell string 30 includes solder strips 301 and a plurality of solar cells 302. The solder strips 301 are configured to connect adjacent solar cells 302. The solar cells 302 include a first direction X, a second direction Y, and a third direction Z perpendicular in pairs. The first direction X is a width direction of the solar cell 302, the second direction Y is a length direction of the solar cell 302, and the third direction Z is a thickness direction of the solar cell 302. The plurality of solar cells 302 are spaced apart along the first direction X and/or the second direction Y For ease of description, in the embodiments of the present disclosure, the solar cells 302 staggered along the first direction X are denoted as first solar cells and second solar cells respectively. That is, the first solar cells and the second solar cells are connected through the solder strips 301.

The first packaging adhesive film 20 and the second packaging adhesive film 40 may both be polyolefin elastomer (POE) adhesive films. POE is an ethylene octene copolymer, which is composed of saturated fat chains, and has characteristics of good weather resistance, UV aging resistance, excellent heat resistance, low temperature resistance, a wide range of use temperatures, good light transmittance, excellent electrical insulation, high cost performance, and easy manufacturing. Ethylene vinyl acetate (EVA) adhesive films may also be used. The EVA adhesive film is the most common adhesive film, which is mainly composed of EVA, a small amount of crosslinking agent, assistant crosslinker, anti-aging agent, and other functional additives. EVA is prepared by copolymerization of two monomers, and ethylene chain breaking is relatively stable.

Figure 4:
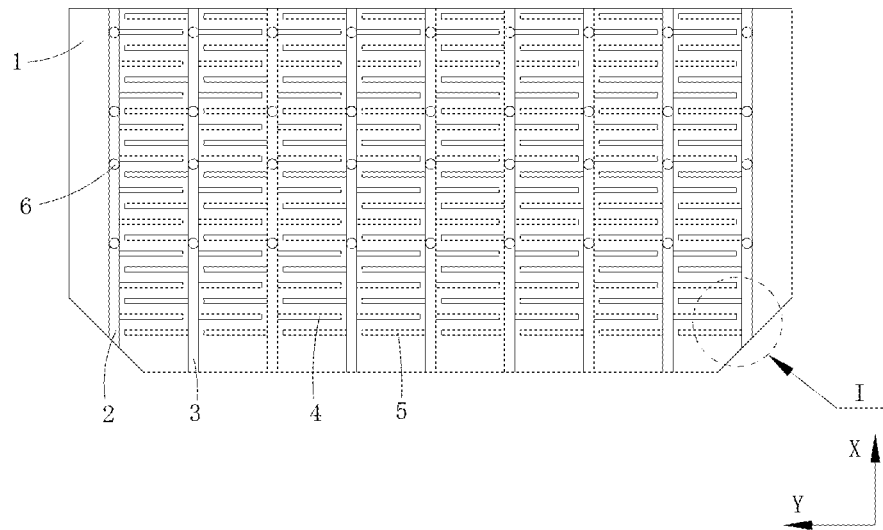
FIG. 4 is a schematic structural diagram of the solar cell in FIG. 3 according to one or more embodiments of the present disclosure.

The solar cells 302 may be half-cut solar cells. The use of the half solar cells can reduce resistance of the solar cells 302, thereby reducing resistance loss of the photovoltaic module. As shown in FIG. 3 and FIG. 4, the solar cell 302 includes a substrate 1. Along the third direction Z, the substrate 1 has a first surface (not marked in the figure) and a second surface (not marked in the figure) arranged opposite to each other. The first surface is located on a side of the photovoltaic module facing the sunlight. The second surface is located on a side of the photovoltaic module facing away from the sunlight. The substrate 1 may be made of a silicon substrate material. The silicon substrate material may include one or more of monocrystalline silicon, polycrystalline silicon, amorphous silicon, and microcrystalline silicon. The substrate 1 may be an N-type semiconductor or a P-type semiconductor. Specific materials and types of the substrate 1 are not limited in the present disclosure. The embodiments of the present disclosure are based on an example in which the substrate 1 is an N-type silicon substrate.

The first surface and/or the second surface of the substrate 1 is provided with a textured surface (not marked in the figure). The textured surface has a light trapping effect, which can reduce reflectivity of a surface of the substrate 1 to less than 10%, thereby improving short-circuit current and conversion efficiency of the solar cell 302. The second surface is subjected to passivation treatment, or the first surface and the second surface are both subjected to passivation treatment, to form a passivation layer 7. The passivation layer 7 has functions of light antireflection and surface passivation. At the same time, doping layers 8 having different polarities are arranged on the second surface. For example, PN junctions are obtained by diffusion of boron sources and phosphorus sources.

The first surface and/or the second surface of the substrate 1 is provided with first busbars 2 and second busbars 3 extending along the first direction X and first fingers 4 and second fingers 5 arranged on the substrate 1 and extending along the second direction Y The first busbars 2 and the second busbars 3 are alternately arranged along the second direction Y and have opposite polarities. For example, the first busbars 2 are positive electrodes, while the second busbars 3 are negative electrodes. Alternatively, the first busbars 2 are negative electrodes, while the second busbars 3 are positive electrodes. The first fingers 4 and the second fingers 5 are alternately arranged along the first direction X. The first fingers 4 are connected to the first busbars 2, and the second fingers 5 are connected to the second busbars 3. Moreover, the first fingers 4 have a same polarity as the first busbars 2, and the second fingers 5 have a same polarity as the second busbars 3.

As shown in FIG. 3, along the first direction X, the first busbars 2 on the first solar cells and the second busbars 3 on the second solar cells are located on a same extension line, and the second busbars 3 on the first solar cells and the first busbars 2 on the second solar cells are located on a same extension line. That is, the first busbars 2 of the first solar cells and the second busbars 3 of the second solar cells adjacent thereto are directly connected through the solder strip 301, and the second busbars 3 of the first solar cells and the first busbars 2 of the second solar cells adjacent thereto are directly connected through the solder strip 301, which effectively avoids warpage of the solar cell 302 and prevent hidden crack problems caused by excessively great stress.

In some embodiments, the first surface and the second surface are both provided with the first busbars 2, the second busbars 3, the first fingers 4, and the second fingers 5, and the solder strips 301 have one part connected to second surfaces of the solar cells 302 and the other part bending and extending and connected to first surfaces of the solar cells 302 adjacent thereto.

In some other embodiments, as shown in FIG. 2, FIG. 3, and FIG. 8 to FIG. 13, the first busbars 2, the second busbars 3, the first fingers 4, the second fingers 5, and the solder strips 301 are all arranged on the second surface. In this case, the photovoltaic module is an IBC. That is, the solder strips 301 are respectively connected to second surfaces of two adjacent solar cells 302, so as to reduce shielding of the first surface by the first busbars 2, the second busbars 3, the first fingers 4, the second fingers 5, and the solder strips 301, thereby increasing the contact area between the first surface and the sunlight and thus improving photoelectric conversion efficiency of the photovoltaic module.

In the present disclosure, for example, the first busbars 2, the second busbars 3, the first fingers 4, the second fingers 5, and the solder strips 301 are all arranged on the second surface. That is, the photovoltaic module is an IBC solar cell.

In addition, the first busbars 2 and the second busbars 3 do not penetrate the passivation layer 7. That is, the first busbars 2 and the second busbars 3 are directly printed on the passivation layer 7. Alternatively, the first busbars 2 and the second busbars 3 penetrate the passivation layer 7 to contact the substrate 1. The first fingers 4 and the second fingers 5 may be directly printed on the substrate 1. That is, the first fingers 4 and the second fingers 5 penetrate the passivation layer 7 to directly contact the doping layer 8.

Along the third direction Z, heights H1 of the first busbars 2 satisfy: 15 μm≤H1≤25 μm, and/or heights H2 of the second busbars 3 satisfy: 15 μm≤H2≤25 μm; and/or heights H3 of the first fingers 4 satisfy: 15 μm≤H3≤25 μm, and/or heights H4 of the second fingers 5 satisfy: 15 μm≤H4≤25 μm.

If the heights of the first busbars 2 and/or the second busbars 3 are less than 15 μm, it is not conducive for the first busbars 2 and the second busbars 3 to collect carriers, thereby having more influence on the photoelectric conversion efficiency of the photovoltaic module. If the heights of the first busbars 2 and/or the second busbars 3 are greater than 25 μm, the soldering tension may be affected. Therefore, 15 μm≤H1≤25 μm and 15 μm≤H2≤25 μm are conducive for the first busbars 2 and the second busbars 3 to collect carriers, which improves the photoelectric conversion efficiency of the photovoltaic module and is also conducive to the soldering tension between the solar cell 302 and the solder strip 301. For example, the heights of the first busbars 2 and/or the second busbars 3 may be 15 μm, 20 μm, or 25 μm.

If the heights of the first fingers 4 and/or the second fingers 5 are less than 15 μm, it is not conducive for the first fingers 4 and the second fingers 5 to collect carriers, thereby affecting the photoelectric conversion efficiency of the photovoltaic module. If the heights of the first fingers 4 and/or the second fingers 5 are greater than 25 μm, manufacturing costs of the first fingers 4 and the second fingers 5 are increased. Therefore, 15 μm≤H3≤25 μm and 15 μm H4≤25 μm can reduce the manufacturing costs of the first fingers 4 and the second fingers 5, and can also improve the photoelectric conversion efficiency of the photovoltaic module. For example, the heights of the first fingers 4 and/or the second fingers 5 may be 15 μm, 20 μm, or 25 μm.

Widths of the first busbars 2 and/or the second busbars 3 along the second direction Y may be in a range of 30 μm to 60 μm, and widths of the first fingers 4 and/or the second fingers 5 along the first direction X may be in a range of 20 μm to 40 μm, which can reduce shielding of an effective area of the photovoltaic module by the first busbars 2, the second busbars 3, the first fingers 4, and the second fingers 5, thereby improving the photoelectric conversion efficiency of the photovoltaic module, reducing manufacturing costs of the first busbars 2, the second busbars 3, the first fingers 4, and the second fingers 5, and improving reliability of the first busbars 2 and the second busbars 3.

As shown in FIG. 5, FIG. 6, and FIG. 8 to FIG. 14, the substrate 1 is provided with a plurality of busbar pits 11, and the doping layers 8 may be located in the busbar pits 11. The plurality of busbar pits 11 are spaced apart long the second direction Y, and at least part of the first busbars 2 and at least part of the second busbars 3 are located in the busbar pits 11, which reduces distances from minority carriers to the doping layers 8, thereby increasing an open-circuit voltage of the solar cell 302 and thus improving the photoelectric conversion efficiency of the photovoltaic module.

When the solder strips 301 are connected to adjacent solar cells 302, at least part of the solder strips 301 are located in the busbar pits 11, which is conducive to improving the soldering tension between the solar cells 302 and the solder strips 301, thereby improving stability of the connection between the solder strips 301 and the solar cells 302.

In one or more embodiments, since the first fingers 4 are not in contact with the second busbars 3 with a different polarity, the first fingers 4 are not required to enter the busbar pits 11 printed with the second busbars 3. Since the first fingers 4 are in contact with the first busbars 2 with the same polarity, the first fingers 4 can enter the busbar pits 11 printed with the first busbars 2 and connected to the first busbars 2. Since the second fingers 5 are not in contact with the first busbars 2 with the different polarity, the second fingers 5 are not required to enter the busbar pits 11 printed with the first busbars 2. Since the second fingers 5 are in contact with the second busbars 3 with the same polarity, the second fingers 5 can enter the busbar pits 11 printed with the second busbars 3 and be connected to the second busbars 3.

Along the third direction Z, a thickness H of the substrate 1 satisfies: 160 μm≤H≤230 μm. For example, the thickness of the substrate 1 in the third direction Z may be 160 μm, 179 μm, 186 μm, 200 μm, 226 μm, or 230 μm.

In some embodiments, since the substrate 1 is provided with the busbar pits 11, if the thickness of the substrate 1 is small, that is, H≤160 μm, the substrate 1 is prone to hidden cracks near the busbar pits 11. If the thickness of the substrate 1 is large, that is, H>230 μm, costs of the solar cell 302 are increased, and an overall thickness of the photovoltaic module is increased. Therefore, 160 μm≤H≤230 μm can reduce the overall thickness of the photovoltaic module to reduce manufacturing costs, increase structural strength of the substrate 1, prolong the service life of the photovoltaic module, and improve operation stability of the photovoltaic module.

Along the third direction Z, depths h1 of the busbar pits 11 satisfy: 30 μm≤h1≤50 μm.

In some embodiments, if the depths of the busbar pits 11 are less than 30 μm, it is not conducive to the soldering tension between the solar cell 302 and the solder strip 301. If the depths of the busbar pits 11 are greater than 50 μm, the risk of hidden cracks of the solar cell 302 may be increased. Therefore, 30 μm≤h1≤50 μm can reduce the risk of hidden cracks of the solar cell 302 and be conducive to improving the soldering tension between the solar cell 302 and the solder strip 301. For example, the depths of the busbar pits 11 may be 30 μm, 35 μm, 40 μm, 45 μm, or 50 μm.

Along the third direction Z, ratios of the depths of the busbar pits 11 to the heights of the first busbars 2 range from 10:3 to 6:5, and/or ratios of the depths of the busbar pits 11 to the heights of the second busbars 3 range from 10:3 to 6:5.

The ratios of the depths of the busbar pits 11 to the heights of the first busbars 2 may be in a large range of 10:1 to 10:9 and a small range of 5:2 to 5:3. In one or more embodiments, along the third direction Z, the ratios of the depths of the busbar pits 11 to the heights of the first busbars 2 are in a range of 10:3 to 6:5, such as 10:3, 2:1, 7:3, 9:4, 5:2, or 6:5. Additionally or alternatively, the ratios of the depths of the busbar pits 11 to the heights of the second busbars 3 may be in a large range of 10:1 to 10:9 and a small range of 5:2 to 5:3. In one or more embodiments, along the third direction Z, the ratios of the depths of the busbar pits 11 to the heights of the second busbars 3 are in a range of 10:3 to 6:5, such as 2:1, 7:3, 9:4, 5:2, or 6:5. The ratios of the depths of the busbar pits 11 to the heights of the first busbars 2 and the ratios of the depths of the busbar pits 11 to the heights of the second busbars 3 may be the same or different.

In certain embodiments, the depths of the busbar pits 11 along the third direction Z range from 30 μm to 50 μm. "Along the third direction Z, ratios of the depths of the busbar pits 11 to the heights of the first busbars 2 and/or the second busbars 3 range from 10:3 to 6:5" is conducive to improving soldering tension between the solar cell 302 and electrode pads 6 and reduces the risk of hidden cracks of the solar cell 302. At the same time, due to a decrease in the distances from the minority carriers to the doping layers 8, the open-circuit voltage of the IBC is increased, thereby improving photoelectric conversion efficiency of the IBC.

In the present disclosure, the depths of the busbar pits along the thickness direction of the substrate range from 30 μm to 50 μm. Along the thickness direction of the substrate, the ratios of the depths of the busbar pits to the heights of the first busbars and/or the second busbars range from 10:3 to 6:5. When the solder strips are connected to the solar cells, part of the solder strips can extend into the busbar pits, which is conducive to improving soldering tension between the solar cells and the solder strips and reduces risks of hidden cracks of the solar cells, thereby improving operation stability of the photovoltaic module.

In addition, cross sections of the busbar pits 11 along the second direction Y are in shapes of rectangles, semi-circles, triangles, arcs, trapezoids, or other transformational structures. The shapes of the cross sections of the busbar pits 11 are not limited in the embodiments of the present disclosure. The embodiments of the present disclosure are based on an example in which cross sections of the busbar pits 11 along the second direction Y are semi-circles.

In one or more embodiments, as shown in FIG. 4, along the first direction X, the electrode pads 6 are spaced apart on both the first busbars 2 and the second busbars 3, and the solder strip 301 is fixedly connected with the solar cell 302 through the electrode pads 6. A number of the electrode pads 6 on one first busbar 2 and one second busbar 3 is no less than 3. In one or more embodiments, the number of the electrode pads 6 may be 4 or more, such as 5 or 6. The specific number of the electrode pads 6 is not limited in the embodiments of the present disclosure.

Figure 5:
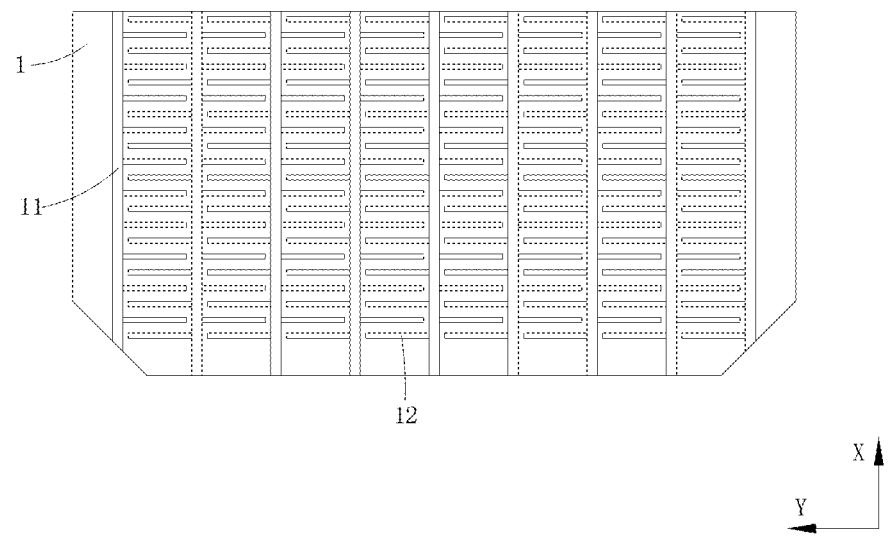
FIG. 5 is a schematic structural diagram of a substrate in FIG. 4 according to one or more embodiments of the present disclosure.
Figure 8:
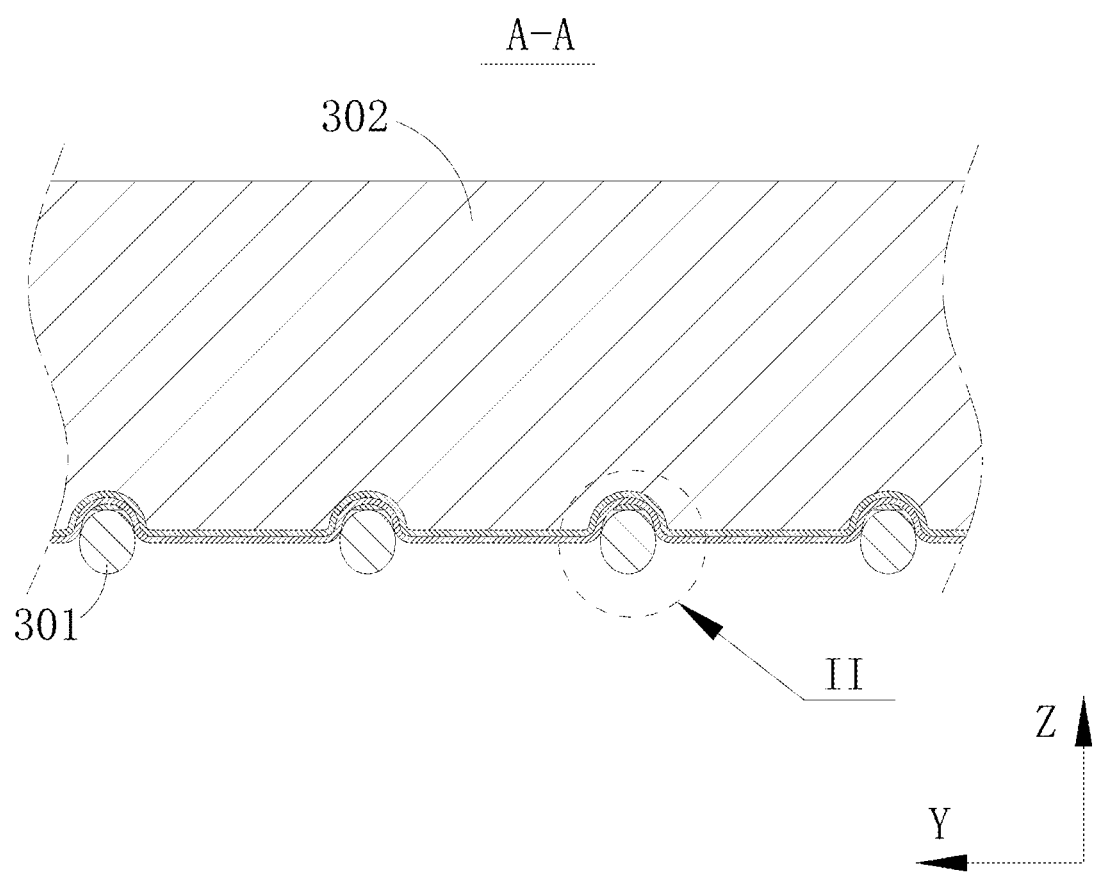
FIG. 8 is a partial sectional view of the solar cell string in FIG. 2 in a direction A-A according to one or more embodiments of the present disclosure.
Figure 9:
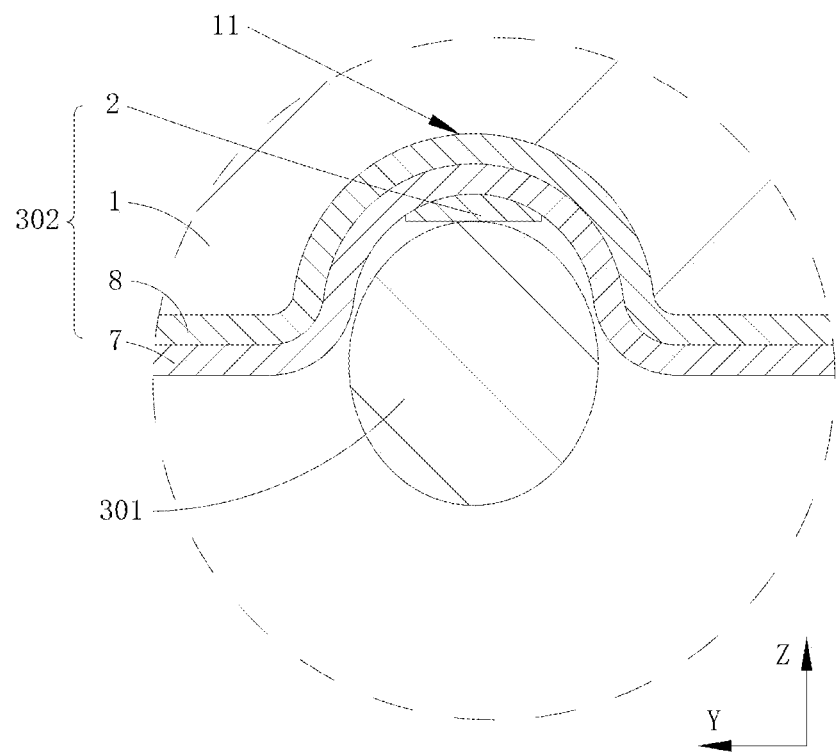
FIG. 9 is an enlarged view of Part II in FIG. 8.
Figure 10:
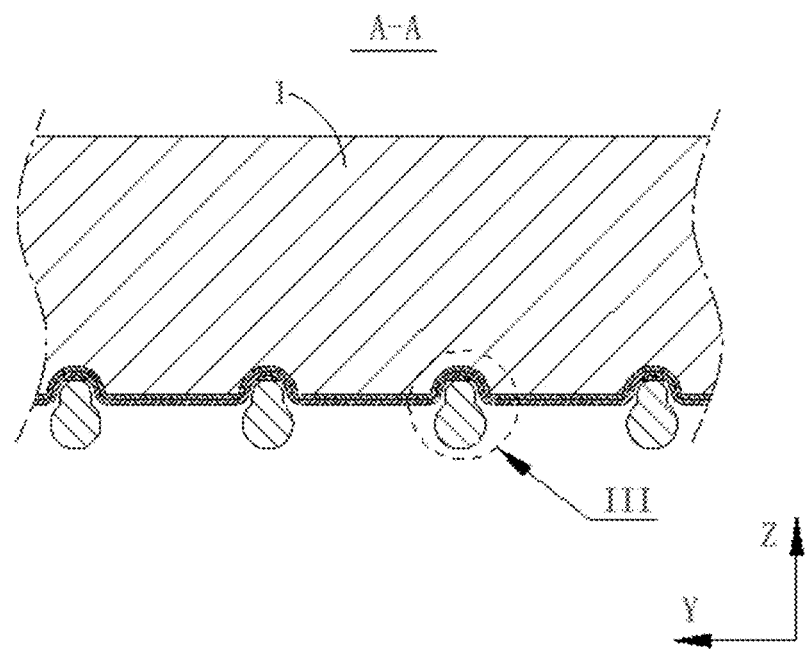
FIG. 10 is a partial sectional view of the solar cell string in FIG. 2 in the direction A-A according to some other embodiments of the present disclosure.
Figure 11:
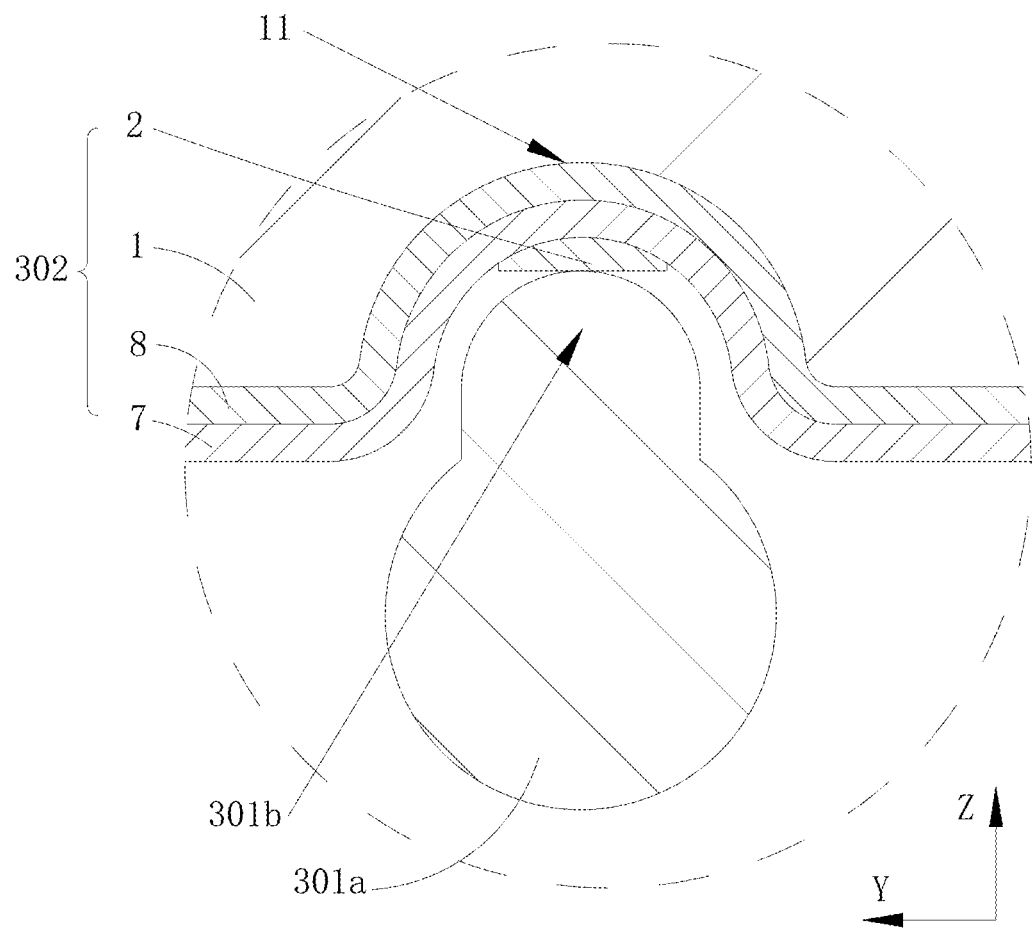
FIG. 11 is an enlarged view of Part III in FIG. 10.
Figure 12:
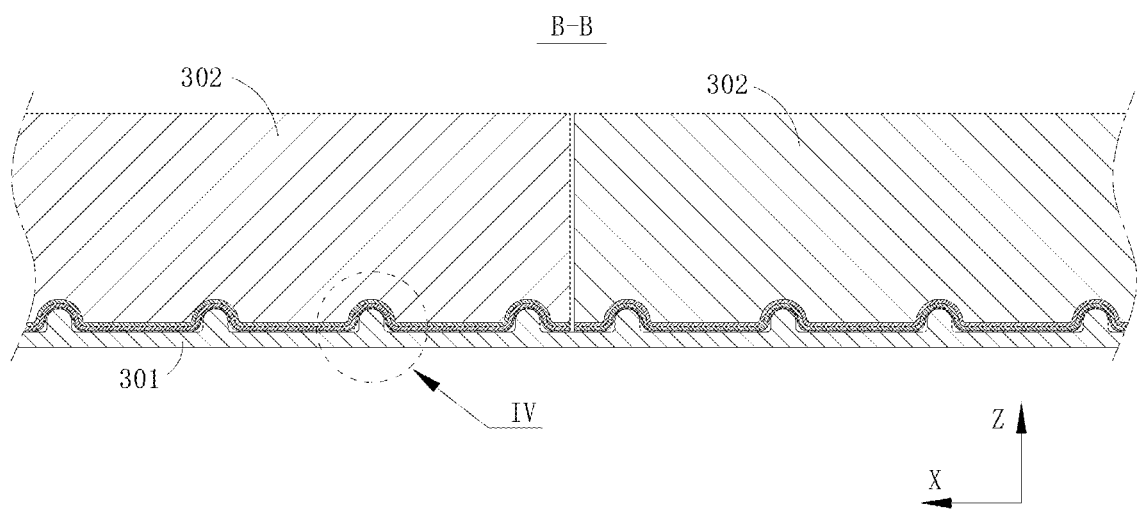
FIG. 12 is a partial sectional view of the solar cell string in FIG. 10 in a direction B-B.
Figure 13:
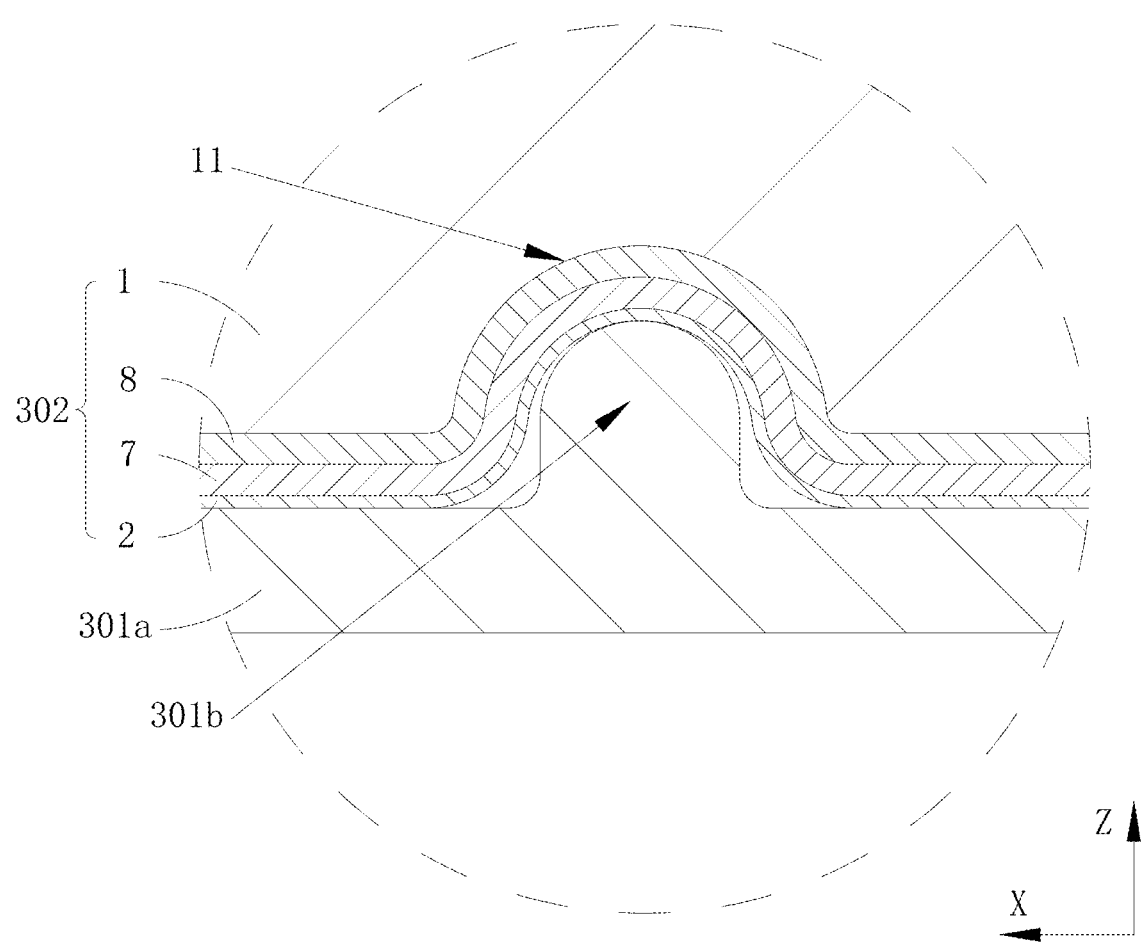
FIG. 13 is an enlarged view of Part IV in FIG. 12.

In some embodiments, as shown in FIG. 4 and FIG. 5, the busbar pits 11 extend along the first direction X, and the first busbars 2 and the second busbars 3 are arranged in the busbar pits 11 as a whole. As shown in FIG. 8 and FIG. 9, the solder strip 301 is directly clamped into the busbar pits 11 and connected to the first busbars 2 and the second busbars 3. The busbar pits 11 extend along the first direction X, which simplifies the manufacturing procedure of the busbar pits 11, thereby reducing manufacturing costs of the busbar pits 11. The solder strip 301 is clamped, in entirety, into the busbar pits 11. When the solder strip 301 moves relative to the solar cell 302, the solder strip 301 can abut against sidewalls of the busbar pits 11 to limit an installation position of the solder strip 301, which reduces installation difficulty of the solder strip 301, thereby improving stability of the connection between the solder strip 301 and the solar cell 302 and reducing the risk of deflection of the solder strip 301. Taking the solder strip 301 on the first busbars 2 as an example, risks of contact and electrical connection of the solder strip 301 with the second fingers 5 are reduced. That is, the risk of short circuit of the solar cell 302 caused by series connection between the first fingers 4 and the second fingers 5 through the first busbars 2 and the solder strip 301 is reduced, thereby improving the operation stability and service life of the solar cell 302.

Figure 6:
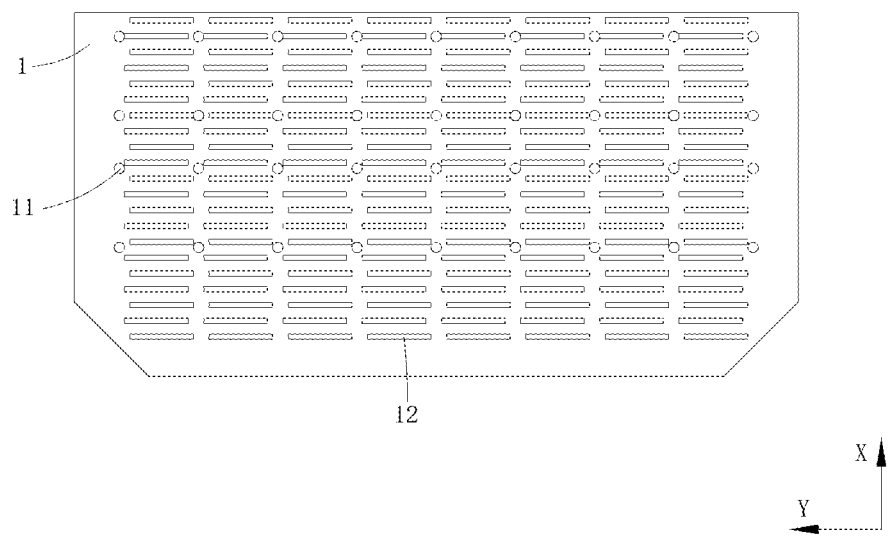
FIG. 6 is a schematic structural diagram of the substrate in FIG. 4 according to some other embodiments of the present disclosure.
Figure 7:
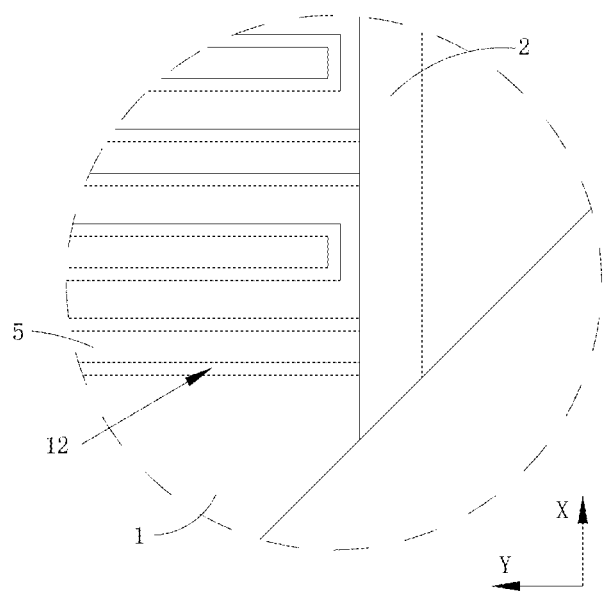
FIG. 7 is an enlarged view of Part I in FIG. 4.

In some other embodiments, as shown in FIG. 4 and FIG. 6, the plurality of busbar pits 11 are spaced apart along the first direction X, and part of the first busbars 2 and part of the second busbars 3 are located in the busbar pits 11. The busbar pits 11 are spaced apart along the first direction X, which reduces an etching area of the substrate 1, thereby helping to improve structural strength of the substrate 1. In one or more embodiments, as shown in FIG. 10, FIG. 11, FIG. 12, and FIG. 13, the solder strip 301 includes body portions 301a and protruding portions 301b. At least part of the protruding portions 301b are located in the busbar pits 11. When the solder strip 301 moves relative to the solar cell 302, the protruding portions 301b can abut against sidewalls of the busbar pits 11 to limit an installation position of the solder strip 301, which reduces the risk of short circuit of the solar cell 302 caused by series connection between the first fingers 4 and the second fingers 5 through the first busbars 2 and the solder strip 301, thereby improving the operation stability and service life of the solar cell 302.

In some embodiments, a number of the busbar pits 11 is no less than that of the protruding portions 301b, so as to facilitate adjustment of the installation position of the solder strip 301. In addition, profile shapes of cross sections of the protruding portions 301b are not limited to rectangles, cylinders, cones, spheres, and the like. The profile shapes of the protruding portions 301b are not limited in the embodiments of the present disclosure.

In one or more embodiments, the busbar pits 11 include first pits (not marked in the figure) and second pits (not marked in the figure) spaced apart along the first direction X. The first pits are arranged opposite to the electrode pads 6 along the third direction Z, and depths of the first pits are greater than the second pits.

In some embodiments, the electrode pads 6 are located at the first pits, and the depths of the first pits are greater than the second pits. After the solder strip 301 is connected to the solar cell 302, the risk of unevenness of surfaces of the solder strip 301 facing away from the solar cell 302 caused by protrusion of the solder strip 301 at the electrode pads 6, thereby facilitating the installation and use of the photovoltaic module. Shallow second recesses are arranged in a non-electrode-pad region, which can increase numbers of the protruding portions 301b and the busbar pits 11, thereby increasing positions of clamping between the solder strip 301 and the solar cell 302, reducing the risk of short circuit of the solar cell 302 caused by local deformation of the solder strip 301, and further improving the operation stability and service life of the solar cell 302.

One or more second pits may be arranged between two adjacent first pits, and one or more first pits may be arranged between two adjacent second pits. Specific distribution manners of the first pits and the second pits are not limited in the present disclosure. Profile shapes of the first pits and the second pits may be the same or different. Specific structures of the first pits and the second pits are not limited in the present disclosure.

In addition, shapes of cross sections of the body portions 301a include, but are not limited to, quadrangles, circles, or other transformational structures. Specific structures of the body portions 301a are not limited in the present disclosure.

Thickness dimensions h3 of the body portions 301a in the third direction Z satisfy: 0.1 mm≤h3≤0.3 mm. For example, thicknesses of the body portions 301a in the third direction Z may be 0.1 mm, 0.15 mm, 0.21 mm, 0.26 mm, or 0.3 mm.

In some embodiments, if the thicknesses of the body portions 301a are small, i.e., h3≤0.1 mm, the solder strip 301 may be cracked and damaged during manufacturing, transportation, and installation, and at the same time, there is a risk that the device cannot solder the solder strip 301 and the electrode pads 6. If the thicknesses of the body portions 301a are large, i.e., h3>0.3 mm, the solder strip 301 easily deviates from a preset installation position under external force, that is, the solder strip 301 is under greater stress, and at the same time, costs of the solder strip 301 are increased.

Therefore, 0.1 mm≤h3≤0.3 mm can facilitate the device to solder the solder strip 301 and the electrode pads 6, reduce costs of the solder strip 301, improve structural strength of the body portions 301a, prolong the service life of the solder strip 301, improve operation stability of the solder strip 301, reduce the stress of the solder strip 301, and improve stability of the soldering.

Heights h4 of the protruding portions 301b in the third direction Z satisfy: 35 μm≤h4≤65 μm; and/or the depths h1 of the busbar pits 11 in the third direction Z satisfy: 35 μm≤h1≤45 μm. For example, the heights of the protruding portions 301b in the third direction Z may be 35 μm, 42 μm, 51 μm, or 65 μm; and the depths of the busbar pits 11 in the third direction Z may be 35 μm, 39 μm, 43 μm, or 45 μm.

In a high-temperature environment, the solder strip 301 may expand due to thermal expansion and cold contraction. If the heights of the protruding portions 301b are large, that is, h4>65 μm, the protruding portions 301b may exert force on the solar cell 302, causing damages to the solar cell 302. If the heights of the protruding portions 301b are small, that is, h4≤35 μm, depths of the connection between the protruding portions 301b and the busbar pits 11 are small. During the installation and fixation, there is a risk that oxygen may enter gaps between the protruding portions 301b and the busbar pits 11 to cause oxidization of the solar cell 302. Therefore, 35 μm≤h4≤65 μm can reduce the risk of damages to the solar cell 302 by the solder strip 301, and can also reduce the risk of oxidization of the solar cell 302, thereby prolonging the service life of the solar cell 302 and improving operation stability of the solar cell 302.

If the depths of the busbar pits 11 are small, that is, h1≤35 μm, there is a risk that the protruding portions 301b are detached from the busbar pits 11. If the depths of the busbar pits 11 are large, that is, h1>45 μm, the strength of the substrate 1 is reduced, and there is a risk that the substrate 1 is damaged during subsequent manufacturing, transportation, and use of the substrate 1. Therefore, 35 μm≤h1≤45 μm can improve stability of the connection between the protruding portions 301b and the busbar pits 11, thereby improving accuracy of the installation position of the solder strip 301, and can reduce risks of defects such as hidden cracks of the solar cell 302, thereby prolonging the service life of the solar cell 302 and improving operation stability of the solar cell 302.

In any one of the above embodiments, 15% to 25% of the solder strip 301 is located in the busbar pits 11. If less than 15% of the solder strip 301 is in the busbar pits 11, contact areas between the solder strip 301 and the busbar pits 11 are excessively small, and the soldering tension is not ideal. If more than 25% of the solder strip 301 is in the busbar pits 11, the solar cell 302 is prone to hidden cracks. Therefore, 15% to 25% of the solder strip 301 is located in the busbar pits, which can prevent excessively small contact areas between the solder strip 301 and the busbar pits 11, help to increase soldering tension between the solar cell 302 and the solder strip 301, and reduce the hidden crack rate of the solar cell 302.

As shown in FIG. 4 to FIG. 7, the substrate 1 is further provided with a plurality of finger pits 12 spaced apart along the first direction X, and at least part of the first fingers 4 and at least part of the second fingers 5 are located in the finger pits 12. Since the first surface of the substrate 1 is provided with no electrodes, photogenerated electrons on the first surface are required to be collected through the electrodes on the second surface (the first fingers 4, the second fingers 5, the first busbars 2, and/or the second busbars 3). Through the finger pits 12, paths of the photogenerated electrons can be reduced within a certain range and recombinations can be reduced, thereby improving the photoelectric conversion efficiency of the solar cell 302.

In some embodiments, the finger pits 12 extend along the second direction Y, and the first fingers 4 and the second fingers 5 are wholly arranged in the finger pits 12. The finger pits 12 extend along the second direction Y, which simplifies the manufacturing procedure of the finger pits 12, thereby reducing manufacturing costs of the finger pits 12.

In some other embodiments, the plurality of finger pits 12 are spaced apart along the second direction Y, and part of the first fingers 4 and part of the second fingers 5 are located in the busbar pits 11. The finger pits 12 are spaced apart along the second direction Y, which reduces an etching area of the substrate 1, thereby helping to improve structural strength of the substrate 1.

In one or more embodiments, along the third direction Z, the depths of the busbar pits 11 are greater than the finger pits 12, which helps to embed part of the solder strip 301 into the busbar pits 11 and further increases the soldering tension.

Along the third direction Z, the depths h2 of the finger pits 12 satisfy: 25 μm≤h2≤35 μm.

In some embodiments, if the depths of the finger pits 12 are less than 25 μm, the finger pits 12 cannot be formed, and the efficiency of the solar cell 302 cannot be improved. If the depths of the finger pits 12 are greater than 35 μm, the substrate 1 is excessively thin, which may lead to an increase in the hidden crack rate. Therefore, 25 μm≤h2≤35 μm can reduce the hidden crack rate of the solar cell 302 and help to form the finger pits 12. For example, the depths of the finger pits 12 may be 25 μm, 28 μm, 31 μm, or 35 μm.

Widths of the busbar pits 11 along the second direction are W1, widths of the finger pits 12 along the first direction are W2, and W1>W2. The widths of the busbar pits 11 along the second direction Y are greater than the widths of the finger pits 12 along the first direction X, which can effectively increase the soldering tension. In other words, in order to enable part of the solder strip 301 to be embedded into the busbar pits 11, the widths and depths thereof are greater than those of the finger pits 12, so as to reduce a risk that the solder strip 301 is installed in the finger bits 12 by mistake.

The widths W1 of the busbar pits 11 along the second direction satisfy: 40 μm≤W1≤70 μm; and/or the widths W2 of the finger pits 12 along the first direction satisfy: 25 μm≤W2≤35 μm.

If the widths of the busbar pits 11 are less than 40 μm, it is not conducive to improving the soldering tension. If the widths of the busbar pits 11 are greater than 70 μm, the risk of hidden cracks of the solar cell 302 is increased. Therefore, 40 μm≤W1≤70 m is more conducive to the soldering tension and reduces the risk of hidden cracks of the solar cell 302. For example, the widths of the busbar pits 11 may be 40 μm, 50 μm, 60 μm, or 70 μm.

If the widths of the finger pits 12 along the first direction X are less than 25 μm, the efficiency of the solar cell 302 cannot be improved. If the widths of the finger pits 12 along the first direction X are greater than 35 μm, the hidden crack rate of the solar cell 302 is increased. Therefore, 25 μm≤W2≤35 μm can improve the efficiency of the solar cell 302 and reduce the hidden crack rate of the solar cell 302. For example, the widths of the finger pits 12 may be 25 μm, 28 μm, 31 μm, or 35 μm.

Figure 14:
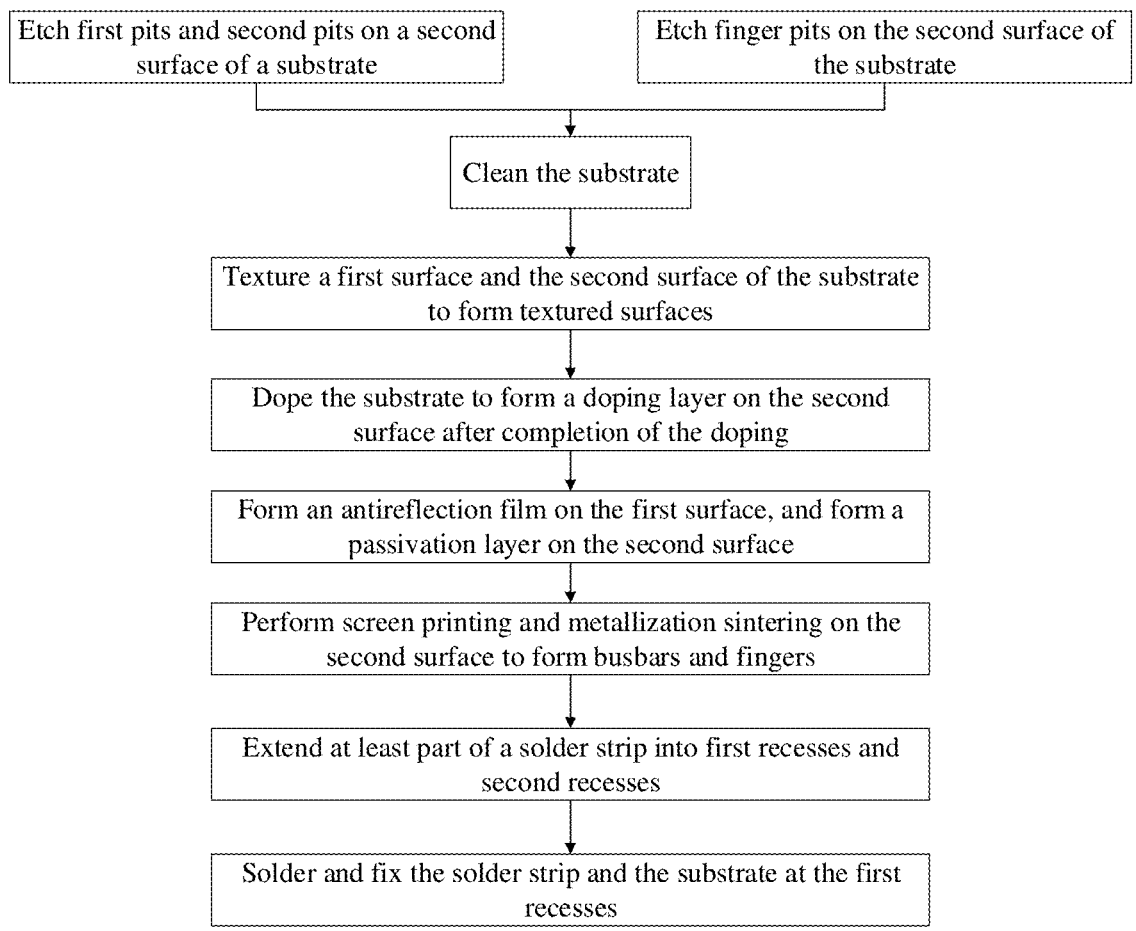
FIG. 14 is a schematic flowchart of a method for manufacturing a photovoltaic module according to one or more embodiments of the present disclosure.

Based on the photovoltaic module in any one of the above embodiments, taking an IBC solar cell as an example, the present disclosure provides a method for manufacturing a photovoltaic module. As shown in FIG. 14, the method for manufacturing a photovoltaic module includes: etching the busbar pits 11 on the second surface of the substrate 1; doping the substrate 1, and forming n+ doping regions and p+ doping regions arranged alternately after the doping; manufacturing a metal electrode on the second surface, the metal electrode includes first busbars 2, second busbars 3, first fingers 4, second fingers 5, and electrode pads 6, the first fingers 4 and the second fingers 5 are in ohmic contact with the n+ doping regions and the p+ doping regions, and at least part of the first busbars 2 and the second busbars 3 are located in the busbar pits 11; placing the solder strips 301 on the solar cells 302, part of the solder strips 301 extending into the busbar pits 11; and fixing the solder strips 301 and the solar cells 302 through the electrode pads 6.

In one or more embodiments, prior to the step of doping the substrate 1, and forming n+ doping regions and p+ doping regions arranged alternately after the doping, the method for manufacturing a photovoltaic module further includes: etching the finger pits 12 on the second surface.

Based on the above, the method for manufacturing a photovoltaic module according to the embodiments of the present disclosure is: etching the busbar pits 11 and the finger pits 12 on the second surface of the substrate 1 by laser etching or mechanical etching; cleaning the substrate 1 to remove damaged structures after the etching; texturing the first surface and the second surface of the substrate 1 to form textured surfaces, the texturing is intended to form uneven structures on originally bright surfaces of the substrate 1 through chemical reaction to extend a propagation path of light on the surfaces thereof, so as to improve light absorption of the solar cells 302; doping the second surface of the substrate 1, and forming a doping layer 8 after completion of the doping, wherein the doping layer 8 includes n+ doping regions and p+ doping regions arranged alternately, for example, PN junctions are obtained by diffusion of boron sources and phosphorus sources; coating the first surface of the substrate 1 by using a plasma enhanced chemical vapor deposition (PECVD) device, to form an antireflection film which can reduce reflection of the light; depositing a layer of SiNx (silicon nitride) on the second surface of the substrate 1 by using the PECVD device, to form a passivation layer 7 having functions of surface passivation and antireflection; manufacturing a metal electrode on the second surface of the substrate 1, the metal electrode includes first busbars 2, second busbars 3, first fingers 4, second fingers 5, and electrode pads 6, the first fingers 4 and the second fingers 5 being in ohmic contact with the n+ doping regions and the p+ doping regions on the second surface, at least part of the first busbars 2 and the second busbars 3 are located in the busbar pits 11, and at least part of the first fingers 4 and at least part of the second fingers 5 are located in the finger pits 12; placing the solder strips 301 on the solar cells 302 to cause part of the solder strips 301 to extend into the busbar pits 11; soldering the solder strips 301 and the solar cells 302 at the electrode pads 6 to form the solar cell string 30; and laminating and fixing the glass 10, the first packaging adhesive film 20, the solar cell string 30, the second packaging adhesive film 40, and the back sheet 50.

In some embodiments, the manufacturing a metal electrode may involve printing silver aluminum paste on the p+ doping regions of the second surface and silver paste on the n+ doping regions of the second side after treatment by screen printing. The first busbars 2, the second busbars 3, and the electrode pads 6 may be directly printed on the passivation layer 7 of the second surface without penetrating the substrate 1. Alternatively, the first busbars 2, the second busbars 3, the first fingers 4, and the second fingers 5 may penetrate the passivation layer 7 to be printed on the doping layer 8, and then are sintered.

In some embodiments, the use of the formed busbar pits 11 and finger pits 12 can increase the soldering tension between the solder cell 302 and the solder strip 301 and can significantly reduce distances from the minority carriers to the doping layers 8, which increases the open-circuit voltage of the IBC, thereby improving efficiency of the IBC.

The above are merely some embodiments of the present disclosure, and are not intended to limit the present disclosure. For those skilled in the art, the present disclosure may be subject to various modifications and changes. Any modification, equivalent replacement, improvement and the like within the spirit and principle of the present disclosure all fall within the protection scope of the present disclosure.

What is claimed is:

1. A photovoltaic module, comprising glass, a first packaging adhesive film, a solar cell string, a second packaging adhesive film, and a back sheet arranged successively along a thickness direction, wherein the solar cell string comprises solar cells and solder strips configured to connect adjacent solar cells;

the solar cells each comprise:

a substrate;

first busbars and second busbars arranged on the substrate and extending along a first direction (X), wherein the first busbars and the second busbars are arranged alternately along a second direction (Y) intersecting with the first direction (X), and the first busbars and the second busbars have opposite polarities;

first fingers and second fingers arranged on the substrate and extending along the second direction (Y), wherein the first fingers and the second fingers are arranged alternately along the first direction (X), the first fingers are connected to the first busbars, the second fingers are connected to the second busbars, the first fingers have a same polarity as the first busbars, and the second fingers have a same polarity as the second busbars; and busbar pits provided on the substrate and spaced apart along the second direction (Y), wherein at least part of the first busbars and at least part of the second busbars are located in the busbar pits, wherein, along a thickness direction of the substrate, each of the busbar pits has a first depth h1 which satisfies: 30 µm≤h1≤50 µm, wherein along the thickness direction of the substrate, a ratio of the first depth h1 of each of the busbar pits to at least one of heights of the first busbars or heights of the second busbars are in a range from 10:3 to 6:5, wherein the solder strips are respectively connected to the first busbars and the second busbars on the adjacent solar cells, and along a thickness direction of the solar cells, the solder strips are arranged on sides of the first busbars and the second busbars away from the substrate, and at least part of the solder strips are located in the busbar pits, and wherein 15% to 25% of the solder strips are located in the busbar pits.

2. The photovoltaic module according to claim 1, wherein the solder strips comprise body portions and protruding portions, the protruding portions are spaced apart along the first direction (X), and at least part of the protruding portions are located in the busbar pits.

3. The photovoltaic module according to claim 2, wherein, along the thickness direction of the solar cells, heights h3 of the body portions satisfy: 150 µm≤h3≤300 µm, and wherein along the thickness direction of the solar cells, heights h4 of the protruding portions satisfy: 35 µm≤h4≤65 µm.

4. The photovoltaic module according to claim 1, wherein the busbar pits extend along the first direction (X), and the first busbars and the second busbars are arranged in the busbar pits.

5. The photovoltaic module according to claim 1, wherein the substrate is further provided with finger pits spaced apart along the first direction (X), and at least part of the first fingers and at least part of the second fingers are located in the finger pits.

6. The photovoltaic module according to claim 5, wherein the finger pits extend along the second direction (Y), and the first fingers and the second fingers are arranged in the finger pits.

7. The photovoltaic module according to claim 5, wherein, along the thickness direction of the substrate, the first depth h1 of each of the busbar pits is greater than a depth of each of the finger pits.

8. The photovoltaic module according to claim 7, wherein, along the thickness direction of the substrate, each of the finger pits has a second depth h2 which satisfies: 25 µm≤h2≤35 µm.

9. The photovoltaic module according to claim 5, wherein widths of the busbar pits along the second direction (Y) are W1, widths of the finger pits along the first direction (X) are W2, and W1>W2.

10. The photovoltaic module according to claim 9, wherein at least one of:
the widths W1 of the busbar pits along the second direction (Y) satisfy: 40 µm≤W1≤70 µm; or
the widths W2 of the finger pits along the first direction (X) satisfy: 25 µm≤W2≤35 µm.

11. The photovoltaic module according to claim 1, wherein cross sections of the busbar pits along the second direction (Y) are in shapes of rectangles, semi-circles, triangles, arcs or trapezoids.

12. The photovoltaic module according to claim 1, wherein the substrate comprises a first surface and a second surface arranged opposite to each other in the thickness direction of the substrate, and the first surface is located on a side of the solar cell facing sunlight, and
wherein the first busbars, the second busbars, the first fingers, and the second fingers are arranged on the second surface.

13. The photovoltaic module according to claim 1, wherein at least one of:
a first height H1 of the first busbars satisfies: 15 µm≤H1≤25 µm;
a second height H2 of the second busbars satisfies: 15 µm≤H2≤25 µm;
a third height H3 of the first fingers satisfies: 15 µm≤H3≤25 µm; or
a fourth height H4 of the second fingers satisfies: 15 µm≤H4≤25 µm.

14. The photovoltaic module according to claim 1, wherein the solar cell further comprises a passivation layer arranged between the substrate and the first busbars and between the substrate and the second busbars, and the passivation layer spaces the substrate apart from the first busbars and the second busbars.

15. The photovoltaic module according to claim 14, wherein the first busbars and the second busbars are directly printed on the passivation layer.

16. The photovoltaic module according to claim 14, wherein the first busbars and the second busbars penetrate the passivation layer to contact the substrate.

17. The photovoltaic module according to claim 1, wherein the solar cell further comprises a doping layer arranged between the substrate and the first busbars and between the substrate and the second busbars, and a passivation layer spaces the substrate apart from the first busbars and the second busbars.

18. The photovoltaic module according to claim 9, wherein a width of the solder strip is greater than W2.

19. A method for manufacturing a photovoltaic module, wherein the photovoltaic module comprises solar cells and solder strips configured to connect adjacent solar cells,
wherein the solar cells each comprise a substrate, first busbars and second busbars arranged on the substrate and extending along a first direction (X), first fingers and second fingers arranged on the substrate and extending along a second direction (Y) intersecting with the first direction (X), and busbar pits arranged on the substrate; the busbar pits are spaced apart along the second direction (Y), and at least part of the first busbars and at least part of the second busbars are located in the busbar pits,
wherein the solder strips are respectively connected to the first busbars and the second busbars on the adjacent solar cells, and along a thickness direction of the solar cells, the solder strips are arranged on sides of the first busbars and the second busbars away from the substrate, and at least part of the solder strips are located in the busbar pits,
wherein 15% to 25% of the solder strips are located in the busbar pits,
wherein the substrate comprises a first surface and a second surface arranged opposite to each other in the thickness direction, the first surface is located on a side of the photovoltaic module facing sunlight, the first busbars, the second busbars, the first fingers, the second fingers, and the solder strips are located on the second surface, and
wherein the method for manufacturing the photovoltaic module comprises:
etching the busbar pits on the second surface of the substrate;
doping the substrate, and forming n+ doping regions and p+ doping regions arranged alternately after the doping;
manufacturing a metal electrode on the second surface;
placing the solder strips on the solar cells with part of the solder strips extending into the busbar pits; and
fixing the solder strips and the solar cells through electrode pads.

20. The method for manufacturing the photovoltaic module according to claim 19, wherein the substrate is further provided with finger pits spaced apart along the first direction (X), and at least part of the first fingers and at least part of the second fingers are located in the finger pits, and
wherein prior to doping the substrate, and forming the n+ doping regions and the p+ doping regions arranged alternately after the doping, the method for manufacturing the photovoltaic module further comprises:
etching the finger pits on the second surface.

* * * * *

UNITED STATES PATENT AND TRADEMARK OFFICE
CERTIFICATE OF CORRECTION

| | | |
|---|---|---|
| PATENT NO. | : 12,199,195 B2 | |
| APPLICATION NO. | : 18/091260 | |
| DATED | : January 14, 2025 | |
| INVENTOR(S) | : Yuncheng Cao et al. | |

It is certified that error appears in the above-identified patent and that said Letters Patent is hereby corrected as shown below:

On the Title Page

In Column 2, Line 5, item (56) under Other Publications, delete "Report recieved in" and insert --Report received in--.

In the Specification

In Column 2, Line 38, delete "$W1 \geq W2$." and insert --$W1 > W2$.--.

In Column 5, Line 22, delete "direction Y For" and insert --direction Y. For--.

In Column 6, Line 14, delete "direction Y The" and insert --direction Y. The--.

In Column 7, Line 34, delete "15 μm H4≤25 μm" and insert --15 μm≤H4≤25 μm--.

In Column 7, Line 55, delete "apart long the" and insert --apart along the--.

In Column 8, Line 21, delete "H≤160 μm," and insert --H<160 μm,--.

In Column 10, Line 59, delete "h3≤0.1 mm," and insert --h3<0.1 mm,--.

In Column 11, Line 21, delete "h4≤35 μm," and insert --h4<35 μm,--.

In Column 11, Line 31, delete "h1≤35 μm," and insert --h1<35 μm,--.

Signed and Sealed this
Thirteenth Day of May, 2025

Coke Morgan Stewart
*Acting Director of the United States Patent and Trademark Office*